United States Patent
Kurosawa et al.

(10) Patent No.: US 6,865,066 B2
(45) Date of Patent: Mar. 8, 2005

(54) VOLTAGE-CONTROLLED VARIABLE-CAPACITANCE DEVICE

(75) Inventors: Susumu Kurosawa, Kanagawa (JP); Yuki Fujimoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/742,879

(22) Filed: Dec. 23, 2003

(65) Prior Publication Data

US 2004/0136140 A1 Jul. 15, 2004

(30) Foreign Application Priority Data

Dec. 27, 2002 (JP) ........................................ 2002-382285

(51) Int. Cl.$^7$ ................................................ H01G 7/00
(52) U.S. Cl. ...................... 361/277; 361/272; 361/278; 361/287; 361/292; 361/296
(58) Field of Search ................................ 361/272, 273, 361/277, 278, 287, 291, 292, 296, 290, 293, 298.1, 281, 283.3, 298.2, 298.4

(56) References Cited

U.S. PATENT DOCUMENTS 6,509,805 B2    1/2003   Ochiai
6,737,929 B1 *  5/2004   Cui et al. ............... 331/177 V
2004/0012450 A1 * 1/2004 Nguyen ...................... 331/100

FOREIGN PATENT DOCUMENTS

JP      2002-043842     2/2002

* cited by examiner

*Primary Examiner*—Dean A. Reichard
*Assistant Examiner*—Nguyen T. Ha
(74) *Attorney, Agent, or Firm*—Foley & Lardner LLP

(57) ABSTRACT

First and second varactors are disposed on a surface of a P-type substrate. The first varactor includes an N well disposed in the surface of the P-type substrate, a gate insulator disposed on the N well, and an N-type polysilicon layer disposed on the gate insulator. The second varactor includes an N well disposed in the surface of the P-type substrate, a gate insulator disposed on the N well, and a P-type polysilicon layer disposed on the gate insulator. The N-type polysilicon layer and P-type polysilicon layer are connected to a gate terminal. The N wells are connected to an SD terminal via P$^+$ diffusion layers. The N-type polysilicon layer and P-type polysilicon layer have different work functions.

13 Claims, 3 Drawing Sheets

VOLTAGE-CONTROLLED VARIABLE-CAPACITANCE DEVICE

BACKGROUND OF THE INVENTION

1. Field of the Invention

The present invention relates to a voltage-controlled variable-capacitance device including a plurality of varactors, and more particularly relates to a voltage-controlled variable-capacitance device in which the correlation between applied voltage and capacitance can be selected.

2. Description of the Related Art

The oscillation frequency of a known voltage-controlled oscillator (VCO) is controlled using a voltage-controlled variable-capacitance device. The voltage-controlled variable-capacitance device generally includes a metal oxide semiconductor (MOS) varactor.

FIG. 1 is a sectional view of a known voltage-controlled variable-capacitance device. This known voltage-controlled variable-capacitance device is disposed in a semiconductor integrated circuit and includes a MOS varactor. Referring to FIG. 1, the voltage-controlled variable-capacitance device includes a P-type substrate 1 and an N well 2 disposed in the surface of the P-type substrate 1. The N well 2 is formed when an N well of a P-channel metal oxide semiconductor field effect transistor (MOSFET) is formed in the semiconductor integrated circuit provided with the varactor.

A gate insulator 6 is disposed on the N well 2. An N-type polysilicon layer 11 is disposed on the gate insulator 6 and is connected to a gate terminal 7. The gate insulator 6 is formed at the same time as a gate insulator of an N-channel MOSFET. The N-channel polysilicon layer 11 is formed at the same time as a gate electrode of the N-channel MOSFET.

N+ diffusion layers 3 are disposed at two positions on the surface of the N well 2. When viewed from a direction perpendicular to the surface of the P-type substrate 1 (hereinafter simply referred to as the perpendicular direction), the N+ diffusion layers 3 are separated from each other by the N-type polysilicon layer 11. The N+ diffusion layers 3 are formed at the same time as the source and drain of the N-channel MOSFET. The N+ diffusion layers 3 are connected to an SD terminal 8. Accordingly, the varactor includes the N well 2, the N+ diffusion layers 3, the gate insulator 6, and the N-type polysilicon layer 11.

In this known voltage-controlled variable-capacitance device, a change in voltage applied between the gate terminal 7 and the SD terminal 8 causes a change in capacitance between the N well 2 and the N-type polysilicon layer 11. Specifically, when a positive potential is applied to the gate terminal 7 whereas a negative potential is applied to the SD terminal 8, thereby having a sufficiently high voltage between the gate terminal 7 and the SD terminal 8, the varactor enters an accumulation mode in which the capacitance of the varactor becomes approximately equal to the capacitance of the gate insulator 6, that is, the maximum capacitance. When the potential applied to the gate terminal 7 is changed toward a negative potential, a depletion layer is formed immediately below the N-type polysilicon layer 11 of the N well 2. As this depletion layer expands, the capacitance of the varactor becomes smaller. When the potential of the gate terminal 7 is sufficiently low, the expansion of the depletion layer saturates. As a result, the reduction of the capacitance stops, and the capacitance reaches a minimum.

As described above, the voltage-controlled variable-capacitance device including the varactor is formed at the same time as the N-channel and P-channel MOSFETs of the semiconductor integrated circuit. The voltage-controlled variable-capacitance device is advantageous in that it can be formed without modifying the process of manufacturing the semiconductor integrated circuit or performing an additional process.

However, this known voltage-controlled variable-capacitance device has the following problems. Since the MOS varactor is formed at the same time as the MOSFETs by the MOSFET manufacturing process, the characteristics of the MOS varactor are determined by the manufacturing conditions of the MOSFETs. To use this varactor to control the oscillation frequency of the VCO, it is preferable that the voltage dependence of the capacitance between the gate and the substrate, that is, the high-frequency C-V characteristics, be optimized in accordance with the circuit, such as the VCO including this voltage-controlled variable-capacitance device. For example, when the curve indicating the correlation between the voltage and the capacitance (C-V curve) is too steep, it becomes difficult to control the oscillation frequency of the VCO.

To only change the high-frequency C-V characteristics of the voltage-controlled variable-capacitance device, for example, a method of changing the impurity concentration in the N well 2 shown in FIG. 1 is known. FIG. 2 is a graph showing the high-frequency C-V characteristics, wherein the abscissa represents the gate-SD voltage and the ordinate represents the gate-SD capacitance, when the impurity concentration in the N well 2 (see FIG. 1) is changed within the range $1 \times 10^{17}$ to $1 \times 10^{18}$ cm$^{-3}$. FIG. 2 demonstrates that an increase in the impurity concentration in the N well 2 causes the C-V curve to move in the direction indicated by the arrow 31.

As described above, an increase in the impurity concentration in the N well changes the high-frequency C-V characteristics of the varactor, that is, smoothes the C-V curve. To optimize the impurity concentration in the N well, a special step of introducing an impurity to the N well is necessary. Therefore, the varactor cannot be manufactured at the same time as the N well of the P-channel MOSFET. Alternatively, the process of manufacturing the P-channel MOSFET must be modified, resulting in a change in the characteristics of the P-channel MOSFET. Referring again to FIG. 2, a change in the impurity concentration in the N well induces a change in the expansion of the depletion layer, thereby changing the minimum capacitance. The minimum capacitance of the voltage-controlled variable-capacitance device determines the upper limit of the oscillation frequency of the VCO, and the maximum capacitance of the voltage-controlled variable-capacitance device determines the lower limit of the oscillation frequency of the VCO. A change in the minimum capacitance of the voltage-controlled variable-capacitance device is undesirable since such a change may result in a change in the range of the oscillation frequency of the VCO.

To only change the characteristics of the voltage-controlled variable-capacitance device, a method of changing the material of the gate insulator or the thickness of the gate insulator or a method of changing the shape of the gate electrode has been proposed. As in the previous method of changing the impurity concentration in the N well, these methods require an additional special process or modification of the manufacturing conditions of the MOSFET. These methods are thus unrealistic.

A technique has been disclosed for setting the rate of change of capacitance to an arbitrary value by generating a plurality of voltages by voltage drop means and applying these plural voltages to a plurality of varactors (e.g., Japanese Unexamined Patent Application Publication No. 2002-43842).

This known technique has the following problems. Since the technique requires the voltage drop means, the circuit structure becomes more complicated and larger. Also, since this circuit does not operate unless a sufficiently high control voltage is applied, this circuit is capable of only limited voltage reduction in the semiconductor integrated circuit.

SUMMARY OF THE INVENTION

Accordingly, it is an object of the present invention to provide a voltage-controlled variable-capacitance device that can be manufactured without changing a known manufacturing process or performing an additional process, in which an increase in the size and voltage of a circuit for the voltage-controlled variable-capacitance device is suppressed, the maximum and minimum capacitances per unit area of electrode remain unchanged, and the high-frequency C-V characteristics are arbitrarily selected.

According to an aspect of the present invention, a voltage-controlled variable-capacitance device is provided including one or plural first and second varactors connected in parallel. The first and second varactors each include a first current-conducting section connected to a first terminal; and a second current-conducting section connected to a second terminal. The first and second current-conducting sections form a capacitance. The work function of a material for the second current-conducting section of the first varactor differs from the work function of a material for the second current-conducting section of the second varactor. The numbers of first and second varactors are determined in accordance with a desired correlation of a voltage applied between the first terminal and the second terminal with the capacitance between each of the first current-conducting sections and each of the second current-conducting sections.

According to the present invention, the second current-conducting sections of the first and second varactors are formed of materials having different work functions, thereby making the high-frequency C-V characteristics of the first varactor different from those of the second varactor. The overall high-frequency C-V characteristics are arbitrarily selected by connecting arbitrary numbers of first and second varactors in parallel. By selecting materials generally used for a semiconductor integrated circuit as the materials for the second current-conducting sections, the voltage-controlled variable-capacitance device of the present invention can be manufactured without modifying a known process or performing an additional process. The voltage-controlled variable-capacitance device of the present invention can be manufactured by connecting a plurality of varactors in parallel. Since a special circuit other than the varactors is unnecessary, an increase in the size and voltage of the device is suppressed.

Each of the first current-conducting sections may be a well disposed in a surface of a substrate, each of the second current-conducting sections may be an electrode disposed above the well, and an insulator may be disposed between the well and the electrode. The material for the second current-conducting section of the first varactor may be P-type polysilicon, and the material for the second current-conducting section of the second varactor may be N-type polysilicon. Therefore, the voltage-controlled variable-capacitance device according to the present invention can be formed easily by a general process of manufacturing a semiconductor integrated circuit.

According to another aspect of the present invention, a voltage-controlled variable-capacitance device is provided including a substrate; and one-or plural first and second varactors disposed on a surface of the substrate. The first and second varactors are connected in parallel. The first and second varactors each include a well disposed in the surface of the substrate and connected to a first terminal; an insulator disposed on the well; and an electrode disposed on the insulator and connected to a second terminal. The electrode is separated from the well by the insulator. The work function of a material for the electrode of the first varactor differs from the work function of a material for the electrode of the second varactor. The numbers of first and second varactors are determined in accordance with a desired correlation of a voltage applied between the first terminal and the second terminal with the capacitance between each of the wells and each of the electrodes.

According to the present invention, in the first and second varactors, capacitances are formed by the wells and the electrodes, respectively. By forming the electrodes of the first and second varactors using materials having different work functions, the high-frequency C-V characteristics of the first varactor are made different from those of the second varactor. By connecting arbitrary numbers of first and second varactors in parallel, the overall high-frequency C-V characteristics are arbitrarily selected. By selecting materials generally used for a semiconductor integrated circuit as the materials for the electrodes of the first and second varactors, the voltage-controlled variable-capacitance device of the present invention can be manufactured without modifying a known semiconductor-integrated-circuit manufacturing process or performing an additional process. The voltage-controlled variable-capacitance device of the present invention can be manufactured by connecting a plurality of varactors in parallel. Since a special circuit other than the varactors is unnecessary, an increase in the size and voltage of the device is suppressed. According to the present invention, a change in the high-frequency C-V characteristics of the voltage-controlled variable-capacitance device does not cause a change in the maximum or minimum capacitance per unit area of electrode. The circuit design thus becomes simplified.

Preferably, at least one diffusion section of the same conductivity type as that of the well is disposed on the surface of the well, the diffusion section being connected to the first terminal. Accordingly, the diffusion section functions as a contact with the well, thereby transmitting a voltage applied to the first terminal to the well in a more reliable manner.

Preferably, when viewed from a direction perpendicular to the surface of the substrate, the diffusion sections are disposed at two positions so as to have the electrode therebetween. In the first or second varactor, in a case where the electrode is formed of a semiconductor material of conductivity type differing from that of the diffusion sections, when viewed from the direction perpendicular to the surface of the substrate, other diffusion sections of the same conductivity type as that of the semiconductor material may be disposed between the electrode and the diffusion sections. Accordingly, margins are reliably provided at the time an impurity of conductivity type differing from that of the diffusion sections is introduced into the electrode. Manufacturing thus becomes simplified.

Preferably, the material for the electrode of the first varactor is P-type polysilicon, and the material for the electrode of the second varactor is N-type polysilicon. The substrate may be a semiconductor substrate of conductivity type differing from that of the wells.

According to the present invention, arbitrary numbers of first and second varactors whose gate electrodes have different work functions are disposed. By connecting these first and second varactors in parallel, the high-frequency C-V characteristics are arbitrarily selected. By using materials generally used for a semiconductor integrated circuit as materials for the electrodes of the first and second varactors, the voltage-controlled variable-capacitance device can be manufactured without modifying a known semiconductor-integrated-circuit manufacturing process or performing an additional process.

DETAILED DESCRIPTION OF THE PREFERRED EMBODIMENTS

Figure 3:
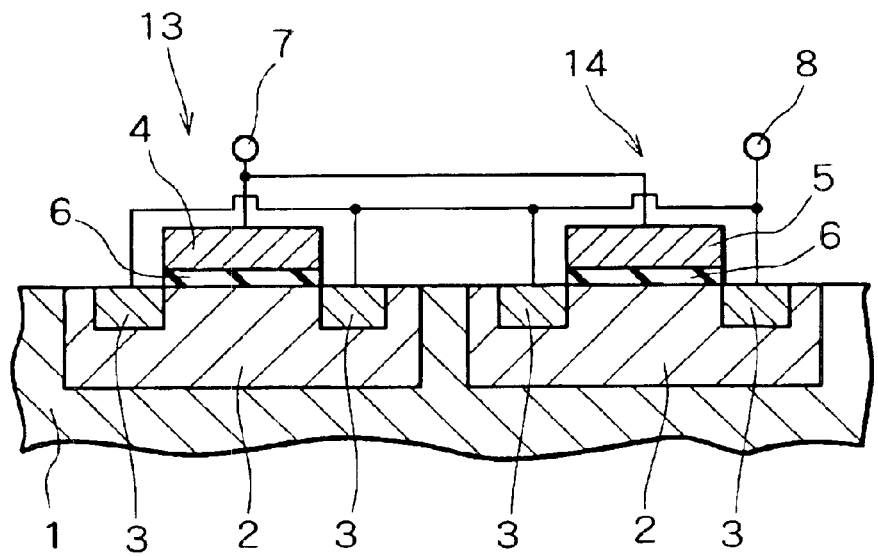
FIG. 3 is a sectional view of a voltage-controlled variable-capacitance device according to a first embodiment of the present invention.
Figure 4:
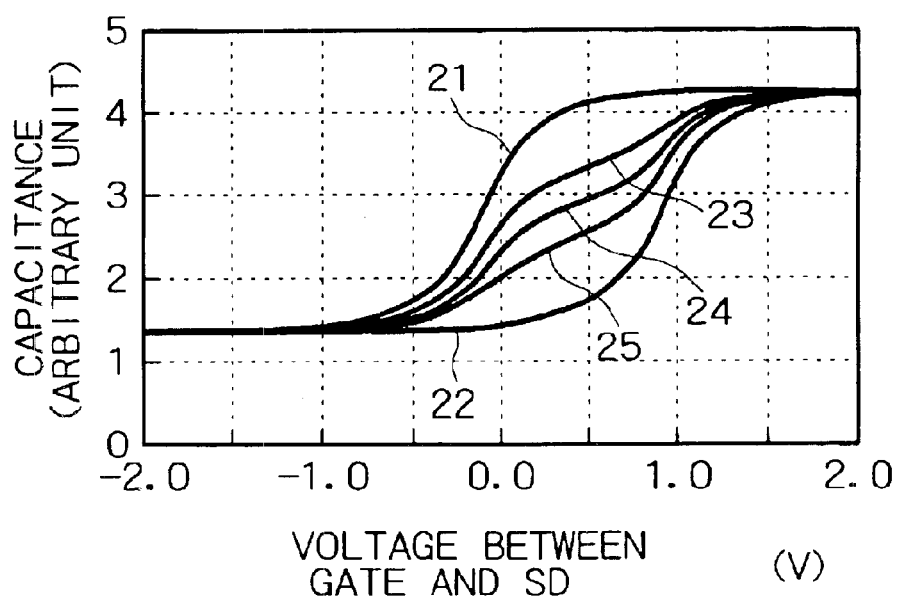
FIG. 4 is a graph showing the high-frequency C-V characteristics of the voltage-controlled variable-capacitance device according to the first embodiment, wherein the abscissa represents the gate-SD voltage and the ordinate represents the gate-SD capacitance.

With reference to the accompanying drawings, the embodiments of the present invention will be specifically described. A first embodiment of the present invention will now be described. FIG. 3 is a sectional view of a voltage-controlled variable-capacitance device according to the first embodiment. FIG. 4 is a graph showing the high-frequency C-V characteristics of the voltage-controlled variable-capacitance device according to the first embodiment, wherein the abscissa represents the gate-SD voltage and the ordinate represents the gate-SD capacitance.

The voltage-controlled variable-capacitance device according to the first embodiment is included in a semiconductor integrated circuit. This semiconductor integrated circuit includes, in addition to the voltage-controlled variable-capacitance device, an N-channel MOSFET and a P-channel MOSFET. Referring to FIG. 3, the voltage-controlled variable-capacitance device includes a plurality of MOS varactors. The voltage-controlled variable-capacitance device also includes a P-type substrate 1 on which varactors 13 and 14 are disposed. As will be described later, the varactors 13 and 14 have gate electrodes with different work functions. Although one varactor 13 and one varactor 14 are shown in FIG. 3, the semiconductor integrated circuit may include a plurality of varactors 13 and/or 14.

The varactor 13 includes an N well 2 disposed in the surface of the P-type substrate 1. The N well 2 is formed at the same time an N well of the P-channel MOSFET is formed in the semiconductor integrated circuit. A gate insulator 6 is disposed on the N well 2. An N-type polysilicon layer 4 serving as a gate electrode is disposed on the gate insulator 6. In other words, the N-type polysilicon layer 4 is separated from the N well 2 by the gate insulator 6. An N-type impurity such as arsenic (As) is introduced at a concentration of $1\times10^{20}$ to $1\times10^{21}$ cm$^{-3}$ into the N-type polysilicon layer 4. The work function of the N-type polysilicon layer 4 is, for example, 4.0 eV. The gate insulator 6 is formed at the same time as a gate insulator of the N-channel MOSFET. The N-type polysilicon layer 4 is formed at the same time as a gate electrode of the N-channel MOSFET.

N$^+$ diffusion layers 3 are disposed at two positions on the surface of the N well 2. When viewed from the perpendicular direction, the N$^+$ diffusion layers 3 are separated from each other by the N-type polysilicon layer 4. The N$^+$ diffusion layers 3 are formed at the same time as the source and drain of the N-channel MOSFET. When viewed from the perpendicular direction, the N$^+$ diffusion layers 3 are adjacent to the N-type polysilicon layer 4. Since the gate insulator 6 is disposed below the N-type polysilicon layer 4, the N$^+$ diffusion layers 3 and the N-type polysilicon layer 4 are insulated by the gate insulator 6. Accordingly, the varactor 13 includes the N well 2, the N$^+$ diffusion layers 3, the gate insulator 6, and the N-type polysilicon layer 4.

Similarly, the varactor 14 includes an N well 2 disposed in the surface of the P-type substrate 1. A gate insulator 6 is disposed on the N well 2. A P-type polysilicon layer 5 serving as a gate electrode is disposed on the gate insulator 6. The P-type polysilicon layer 5 is formed at the same time as a gate electrode of the P-channel MOSFET. A P-type impurity such as boron (B) is introduced at a concentration of $1\times10^{20}$ to $1\times10^{21}$ cm$^{-3}$ into the P-type polysilicon layer 5. The work function of the P-type polysilicon layer 5 is, for example, 5.0 eV.

When viewed from the perpendicular direction, N$^+$ diffusion layers 3 are disposed on the surface of the N well 2 at two positions, which are separated from each other by the P-type polysilicon layer 5. When viewed from the perpendicular direction, the N$^+$ diffusion layers 3 are adjacent to the P-type polysilicon layer 5. Since the gate insulator 6 is disposed below the P-type polysilicon layer 5, the N$^+$ diffusion layers 3 and the P-type polysilicon layer 5 are insulated by the gate insulator 6. Accordingly, the varactor 14 includes the N well 2, the N$^+$ diffusion layers 3, the gate insulator 6, and the P-type polysilicon layer 5.

In the varactors 13 and 14, the N-type polysilicon layer 4 and the P-type polysilicon layer 5 are connected to a gate terminal 7, and the N$^+$ diffusion layers 3 are connected to an SD terminal 8. In other words, the varactors 13 and 14 are connected in parallel.

Figure 1:
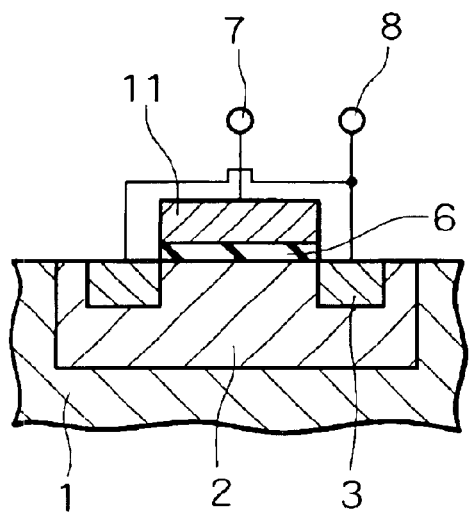
FIG. 1 is a sectional view of a known voltage-controlled variable-capacitance device.
Figure 2:
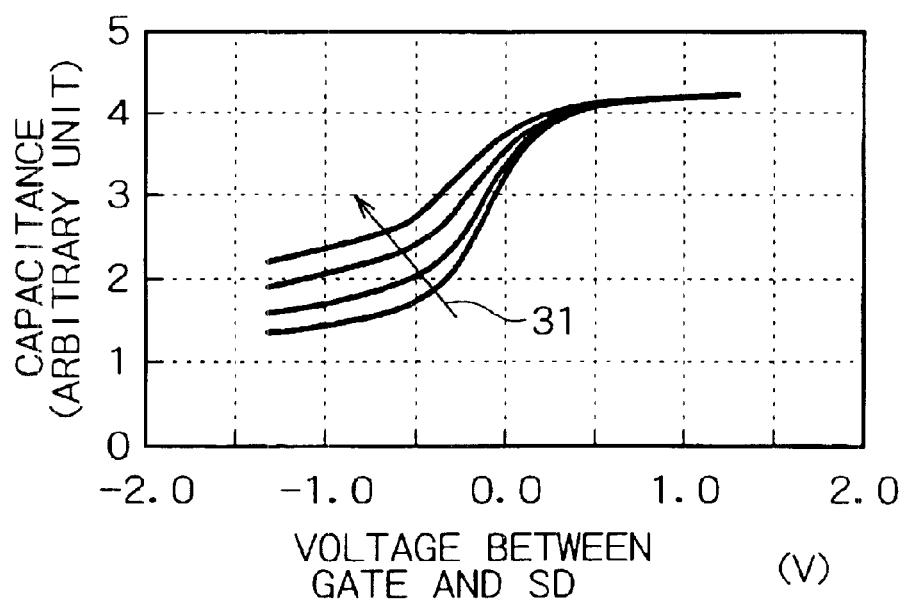
FIG. 2 is a graph showing the high-frequency C-V characteristics, wherein the abscissa represents the gate-SD voltage and the ordinate represents the gate-SD capacitance, when the impurity concentration in an N well is changed.

The operation of the voltage-controlled variable-capacitance device according to the first embodiment of the present invention will now be described. As in a known voltage-controlled variable-capacitance device including a varactor (see FIG. 1), according to the voltage-controlled variable-capacitance device of the first embodiment, a change in voltage applied between the gate terminal 7 and the SD terminal 8 causes a change in capacitance between the N well 2 and the N-type polysilicon layer 4 and a change in capacitance between the N well 2 and the P-type polysilicon layer 5.

Referring to FIG. 4, a curve 21 shows the C-V characteristics of the varactor 13. As described above, the varactor 13 includes the N-type polysilicon layer 4 serving as the gate electrode. A curve 22 shows the C-V characteristics of the varactor 14 including the P-type polysilicon layer 5 serving as the gate electrode. As described above, the work function of the N-type polysilicon is about 4.0 eV, whereas the work function of the P-type polysilicon is about 5.0 eV. Since the work function of the P-type polysilicon is higher than that of the N-type polysilicon by about 1.0 eV, the curve 22 is shifted to a higher voltage by about 1.0 eV, compared with the curve 21.

A curve 24 shows the C-V characteristics of the overall voltage-controlled variable-capacitance device including one varactor 13 and one varactor 14, which are connected in parallel. To compare this C-V characteristic (curve 24) of the overall voltage-controlled variable-capacitance device with the C-V characteristic (curve 21) of the varactor 13 alone and the C-V characteristic (curve 22) of the varactor 14 alone, the curve 24 shows half (½) the capacitance compared with the curves 21 and 22. FIG. 4 shows that the slope of the C-V curve of the voltage-controlled variable-capacitance device of the first embodiment becomes smoother by providing the voltage-controlled variable-capacitance device with the varactors 13 and 14, which are connected in parallel.

A curve 23 shows the C-V characteristics of the voltage-controlled variable-capacitance device provided with two varactors 13 and one varactor 14, which are connected in parallel. A curve 25 shows the C-V characteristics of the voltage-controlled variable-capacitance device provided with one varactor 13 and two varactors 14, which are connected in parallel. The curves 23 and 25 show one-third (⅓) the capacitance compared with the curves 21 and 22.

According to the first embodiment, the gate electrode of the varactor 13 is implemented by the N-type polysilicon layer 4, and the gate electrode of the varactor 14 is implemented by the P-type polysilicon layer 5. By appropriately selecting the numbers of varactors 13 and 14, which are connected in parallel, the high-frequency C-V characteristics of the voltage-controlled variable-capacitance device, that is, particularly the shape of the C-V curve within a voltage range in which the capacitance varies greatly, can be selected. In other words, the number of varactors 13 and the number of varactors 14 are determined in accordance with a desired correlation of the voltage applied between the gate terminal 7 and the SD terminal 8 with the capacitance between the N well 2 and the N-type polysilicon layer 4 and with the capacitance between the N well 2 and the P-type polysilicon layer 5. Therefore, a change in the high-frequency C-V characteristics does not cause a change in the maximum or minimum capacitance per unit area of the gate electrode. The circuit design thus becomes simplified.

Since materials for the semiconductor integrated circuit, such as N-type polysilicon and P-type polysilicon generally used as materials for gate electrodes of MOSFETs, are used as materials for the gate electrodes of the varactors 13 and 14, the voltage-controlled variable-capacitance device of the first embodiment can be manufactured without modifying an existing process or performing an additional process.

In the first embodiment, the voltage-controlled variable-capacitance device is formed by connecting one or plural varactors 13 and 14 in parallel. A special circuit, such as voltage drop means described in Japanese Unexamined Patent Application Publication No. 2002-43842, other than the varactors is unnecessary. An increase in size and voltage of the voltage-controlled variable-capacitance device is thus suppressed.

In the voltage-controlled variable-capacitance device of the first embodiment, the N$^+$ diffusion layers 3 are disposed on the surface of the N well 2. Therefore, the N$^+$ diffusion layers 3 function as a contact with the N well 2. A voltage applied to the SD terminal 8 is reliably transmitted to the N well 2.

In the first embodiment, silicide may be formed on the surfaces of the N-type polysilicon layer 4 and the P-type polysilicon layer 5. Alternatively, low-resistance layers formed of materials with a resistance lower than that of the N-type polysilicon layer 4 and that of the P-type polysilicon layer 5 may be formed on the N-type polysilicon layer 4 and the P-type polysilicon layer 5. As a result, the resistance between the gate terminal 7 and the N-type polysilicon layer 4 and the resistance between the gate terminal 7 and the P-type polysilicon layer 5 are reduced, thereby transmitting a potential applied to the gate terminal 7 to the N-type polysilicon layer 4 and/or the P-type polysilicon layer 5 in a more reliable manner.

Figure 5:
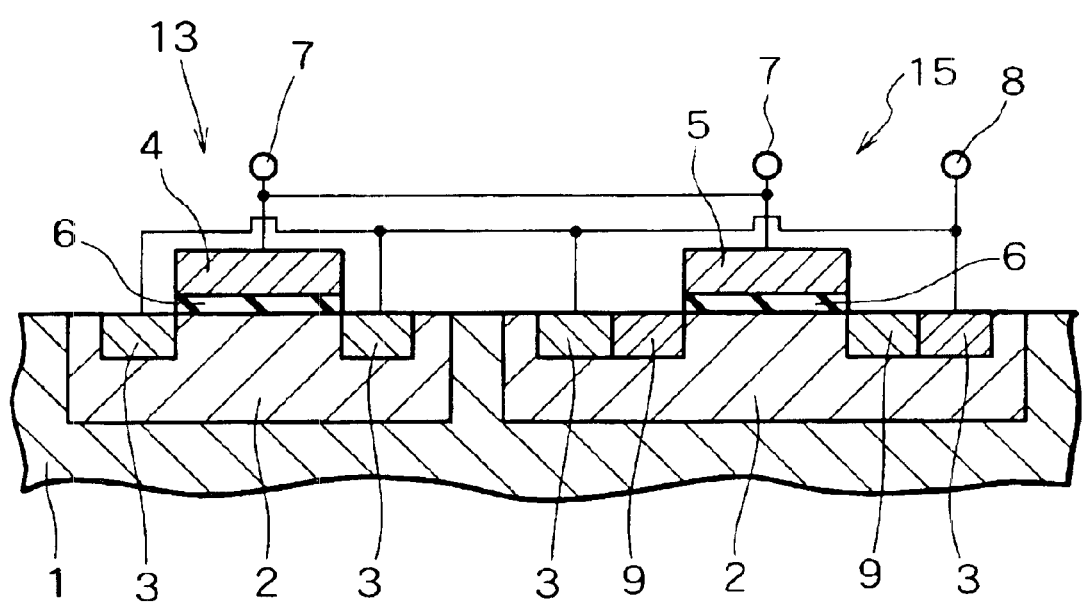
FIG. 5 is a sectional view of a voltage-controlled variable-capacitance device according to a second embodiment of the present invention.

A second embodiment of the present invention will now be described. FIG. 5 is a sectional view of a voltage-controlled variable-capacitance device of the second embodiment. In the second embodiment, the voltage-controlled variable-capacitance device is provided with a varactor 15, instead of the varactor 14 of the first embodiment (see FIG. 3). That is, the voltage-controlled variable-capacitance device of the second embodiment includes the varactors 13 and 15. Unlike the varactor 14, in the varactor 15 viewed from the perpendicular direction, a P-type polysilicon layer 5 is separated from N$^+$ diffusion layers 3 by P$^+$ diffusion layers 9 disposed on the surface of an N well 2. Electrically, the P$^+$ diffusion layers 9 may be floating. The P$^+$ diffusion layers 9 may be connected to the N$^+$ diffusion layers 3 by silicifying the surfaces of the P$^+$ diffusion layers 9 and the N$^+$ diffusion layers 3. Apart from this, the structure of the varactor 15 is the same as that of the varactor 14. Except for the above difference, the structure and operation of the voltage-controlled variable-capacitance device of the second embodiment are the same as those of the first embodiment.

In the second embodiment, when viewed from the perpendicular direction, the P$^+$ diffusion layers 9 are disposed between the P-type polysilicon layer 5 and the N$^+$ diffusion layers 3. In the step of forming the P-type polysilicon layer 5 in a process of manufacturing the voltage-controlled variable-capacitance device, a polysilicon layer is patterned and then doped with a P-type impurity by ion implantation. In such a case, the P-type impurity is prevented from being introduced into the N$^+$ diffusion layers 3. In other words, margins are reliably provided in the step of introducing a P-type impurity, thereby preventing the P-type impurity from being introduced into the N$^+$ diffusion layers 3. If the positional accuracy of the ion implantation to introduce the P-type impurity is sufficiently high, the P$^+$ diffusion layers 9 need not be disposed. The advantages of the second embodiment are the same as those of the first embodiment.

Although an example in which N-type polysilicon and P-type polysilicon are used as materials for the gate electrodes has been described in the first and second embodiments, the present invention is not limited to this example. Any combination of materials that are used as materials for the semiconductor integrated circuit and that have different work functions can be used. For example, metal materials may be used.

Although an example in which the number of parallel-connected varactors is selected at the time the circuit for the voltage-controlled variable-capacitance device is designed has been described in the first and second embodiment, the present invention is not limited to this example. Specifically, many varactors may be formed at the time of design, and a switch may be disposed between each two varactors. By turning on and off the switches, the number of parallel-connected varactors may be selected. In other words, redundant varactors are provided, and the high-frequency C-V characteristics can be changed during use of the voltage-controlled variable-capacitance device.

What is claimed is:

1. A voltage-controlled variable-capacitance device comprising:
   one or plural first and second varactors connected in parallel, said first and second varactors each including:
   a first current-conducting section connected to a first terminal; and
   a second current-conducting section connected to a second terminal, the first and second current-conducting sections forming a capacitance,
   wherein the work function of a material for the second current-conducting section of the first varactor differs from the work function of a material for the second current-conducting section of the second varactor, and
   wherein the numbers of first and second varactors are determined in accordance with a desired correlation of a voltage applied between the first terminal and the second terminal with the capacitance between each of the first current-conducting sections and each of the second current-conducting sections.

2. A voltage-controlled variable-capacitance device according to claim 1, wherein each of the first current-conducting sections comprises a well disposed in a surface of a substrate, each of the second current-conducting sections comprises an electrode disposed above the well, and an insulator is disposed between the well and the electrode.

3. A voltage-controlled variable-capacitance device according to claim 1, wherein the material for the second current-conducting section of the first varactor comprises P-type polysilicon, and the material for the second current-conducting section of the second varactor comprises N-type polysilicon.

4. A voltage-controlled variable-capacitance device comprising:
   a substrate; and
   one or plural first and second varactors disposed on a surface of the substrate, the first and second varactors being connected in parallel, said first and second varactors each including:
   a well disposed in the surface of the substrate and connected to a first terminal;
   an insulator disposed on the well; and
   an electrode disposed on the insulator and connected to a second terminal, the electrode being separated from the well by the insulator,
   wherein the work function of a material for the electrode of the first varactor differs from the work function of a material for the electrode of the second varactor, and
   wherein the numbers of first and second varactors are determined in accordance with a desired correlation of a voltage applied between the first terminal and the second terminal with the capacitance between each of the wells and each of the electrodes.

5. A voltage-controlled variable-capacitance device according to claim 4, wherein at least one diffusion section of the same conductivity type as that of the well is disposed on the surface of the well, the diffusion section being connected to the first terminal.

6. A voltage-controlled variable-capacitance device according to claim 5, wherein, when viewed from a direction perpendicular to the surface of the substrate, the diffusion sections are disposed at two positions so as to have the electrode therebetween.

7. A voltage-controlled variable-capacitance device according to claim 6, wherein, in the first or second varactor, the electrode is formed of a semiconductor material of conductivity type differing from that of the diffusion sections, and, when viewed from the direction perpendicular to the surface of the substrate, other diffusion sections of the same conductivity type as that of the semiconductor material are disposed between the electrode and the diffusion sections.

8. A voltage-controlled variable-capacitance device according to claim 4, wherein the material for the electrode of the first varactor is P-type polysilicon, and the material for the electrode of the second varactor is N-type polysilicon.

9. A voltage-controlled variable-capacitance device according to claim 4, wherein the substrate comprises a semiconductor substrate of conductivity type differing from that of the wells.

10. A voltage-controlled variable-capacitance device according to claim 1, wherein one first varactor and one second varactor are disposed.

11. A voltage-controlled variable-capacitance device according to claim 4, wherein one first varactor and one second varactor are disposed.

12. A voltage-controlled variable-capacitance device according to claim 1, wherein two first varactors and one second varactor are disposed, or one first varactor and two second varactors are disposed.

13. A voltage-controlled variable-capacitance device according to claim 4, wherein two first varactors and one second varactor are disposed, or one first varactor and two second varactors are disposed.

* * * * *